(12) United States Patent
Khlat et al.

(10) Patent No.: US 9,819,335 B2
(45) Date of Patent: Nov. 14, 2017

(54) SWITCHING SUPPLY DELAY COMPENSATION

(71) Applicant: RF Micro Devices, Inc., Greensboro, NC (US)

(72) Inventors: Nadim Khlat, Cugnaux (FR); Michael R. Kay, Summerfield, NC (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/055,119

(22) Filed: Feb. 26, 2016

(65) Prior Publication Data

US 2016/0365836 A1   Dec. 15, 2016

Related U.S. Application Data

(60) Provisional application No. 62/175,772, filed on Jun. 15, 2015.

(51) Int. Cl.

| H03G 3/20 | (2006.01) |
|---|---|
| H03K 5/1536 | (2006.01) |
| H03F 1/02 | (2006.01) |
| H03F 3/24 | (2006.01) |
| H03F 3/19 | (2006.01) |

(52) U.S. Cl.
CPC ......... *H03K 5/1536* (2013.01); *H03F 1/0222* (2013.01); *H03F 1/0266* (2013.01); *H03F 3/19* (2013.01); *H03F 3/245* (2013.01); *H03F 2200/102* (2013.01); *H03F 2200/391* (2013.01); *H03F 2200/432* (2013.01); *H03F 2200/451* (2013.01); *H03F 2200/462* (2013.01)

(58) Field of Classification Search
CPC ..... H03F 1/0211; H03F 1/0222; H03F 1/0238
USPC ........................................ 330/127, 136, 297
See application file for complete search history.

(56) References Cited

U.S. PATENT DOCUMENTS

| 2012/0170690 A1* | 7/2012 | Ngo ...................... H03F 1/0227 375/340 |
|---|---|---|
| 2013/0194037 A1* | 8/2013 | Takahashi ................ H03F 1/32 330/3 |
| 2015/0194989 A1* | 7/2015 | Mkadem ............... H03F 1/3247 375/297 |

\* cited by examiner

*Primary Examiner* — Steven J Mottola
(74) *Attorney, Agent, or Firm* — Withrow & Terranova, P.L.L.C.

(57) ABSTRACT

Circuitry, which includes a parallel amplifier and a switching supply, is disclosed. The parallel amplifier regulates a power supply output voltage based on a power supply control signal and provides a current sense signal, which is representative of a parallel amplifier output current from the parallel amplifier. The switching supply is coupled to the parallel amplifier. The switching supply provides a switching output voltage and makes an early determination of the switching output voltage using the current sense signal and the power supply control signal to at least partially compensate for delay in the switching supply. Additionally, the switching supply drives the parallel amplifier output current toward zero using the switching output voltage to increase efficiency.

19 Claims, 12 Drawing Sheets

SWITCHING SUPPLY DELAY COMPENSATION

RELATED APPLICATIONS

This application claims the benefit of U.S. provisional patent application No. 62/175,772, filed Jun. 15, 2015, the disclosure of which is incorporated herein by reference in its entirety.

FIELD OF THE DISCLOSURE

The present disclosure relates to direct current (DC)-DC converters and circuits that use DC-DC converters.

BACKGROUND

DC-DC converters are often used to provide efficient transfer of energy from a source of DC voltage to a load. However, if an output voltage from the DC-DC converter must be changed rapidly, analog circuitry may be used to help provide the output voltage. As a result, efficiency of the DC-DC converter may be reduced. Thus, there is a need for an efficient DC-DC converter that supports a rapidly changing output voltage.

SUMMARY

Circuitry, which includes a parallel amplifier and a switching supply, is disclosed according to one embodiment of the present disclosure. The parallel amplifier regulates a power supply output voltage based on a power supply control signal and provides a current sense signal, which is representative of a parallel amplifier output current from the parallel amplifier. The switching supply is coupled to the parallel amplifier. The switching supply provides a switching output voltage and makes an early determination of the switching output voltage using the current sense signal and the power supply control signal to at least partially compensate for delay in the switching supply. Additionally, the switching supply drives the parallel amplifier output current toward zero using the switching output voltage to increase efficiency.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

Circuitry, which includes a parallel amplifier and a switching supply, is disclosed according to one embodiment of the present disclosure. The parallel amplifier regulates a power supply output voltage based on a power supply control signal and provides a current sense signal, which is representative of a parallel amplifier output current from the parallel amplifier. The switching supply is coupled to the parallel amplifier. The switching supply provides a switching output voltage and makes an early determination of the switching output voltage using the current sense signal and the power supply control signal to at least partially compensate for delay in the switching supply. Additionally, the switching supply drives the parallel amplifier output current toward zero using the switching output voltage to increase efficiency.

Figure 1:
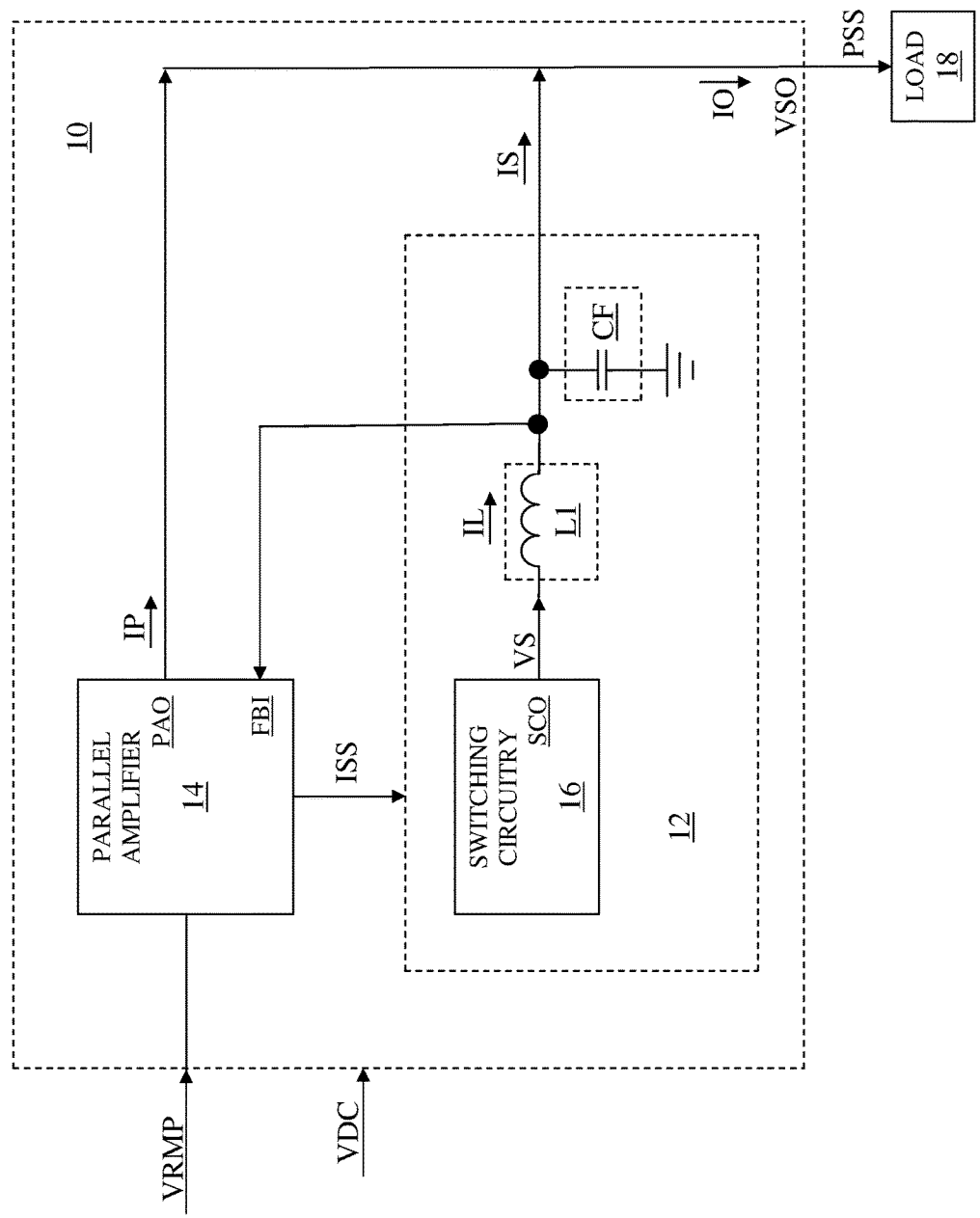
FIG. 1 shows a direct current (DC)-DC converter according to one embodiment of the present disclosure.

FIG. 1 shows a direct current (DC)-DC converter 10 according to one embodiment of the present disclosure. The DC-DC converter 10 includes a switching supply 12, and a parallel amplifier 14. The switching supply 12 includes switching circuitry 16, a first inductive element L1, and a filter capacitive element CF. The parallel amplifier 14 has a feedback input FBI and a parallel amplifier output PAO. The switching circuitry 16 has a switching circuitry output SCO. The first inductive element L1 is coupled between the switching circuitry output SCO and the feedback input FBI. The filter capacitive element CF is coupled between the parallel amplifier output PAO and a ground. In one embodiment of the DC-DC converter 10, the parallel amplifier output PAO is directly coupled to the feedback input FBI, as shown. In general, the switching supply 12 is coupled to the parallel amplifier 14.

In one embodiment of the DC-DC converter 10, the parallel amplifier 14 provides a parallel amplifier output current IP to at least partially provide a power supply output current IO of a power supply output signal PSS via the parallel amplifier output PAO based on a voltage setpoint. Additionally, the parallel amplifier 14 provides a current sense signal ISS to the switching supply 12. The current sense signal ISS is representative of the parallel amplifier output current IP. The switching supply 12 provides a switching supply output current IS to at least partially provide the power supply output current IO of the power supply output signal PSS via the first inductive element L1. The power supply output signal PSS has a power supply output voltage VSO. In this regard, the parallel amplifier output current IP and the switching supply output current IS combine to provide the power supply output current IO.

The switching supply 12 may provide power more efficiently than the parallel amplifier 14. However, the parallel amplifier 14 may provide the power supply output voltage VSO more accurately than the switching supply 12. As such, in one embodiment of the DC-DC converter 10, the parallel amplifier 14 regulates the power supply output voltage VSO based on the voltage setpoint of the power supply output voltage VSO. In one embodiment of the parallel amplifier 14, regulation of the power supply output voltage VSO is further based on sensing a voltage at the feedback input FBI. Further, the switching supply 12 regulates the power supply output signal PSS to minimize the parallel amplifier output current IP to maximize efficiency. In this regard, the parallel amplifier 14 behaves like a voltage source and the switching supply 12 behaves like a current source. Additionally, the switching circuitry 16 provides a switching output voltage VS and an inductor current IL to the first inductive element L1 via the switching circuitry output SCO. In general, in one embodiment of the switching supply 12, the switching supply 12 provides the switching output voltage VS. Further, in one embodiment of the switching supply 12, the switching supply 12 drives the parallel amplifier output current IP toward zero using the switching output voltage VS to increase efficiency of the DC-DC converter 10.

In one embodiment of the DC-DC converter 10, the DC-DC converter 10 receives a DC source signal VDC, such that the parallel amplifier 14 partially provides the power supply output signal PSS using the DC source signal VDC and the switching supply 12 partially provides the power supply output signal PSS using the DC source signal VDC. In one embodiment of the DC-DC converter 10, the DC-DC converter 10 receives a power supply control signal VRMP. In one embodiment of the parallel amplifier 14, the parallel amplifier 14 receives the power supply control signal VRMP, which is representative of the voltage setpoint of the power supply output voltage VSO. In general, the parallel amplifier 14 regulates the power supply output voltage VSO based on the power supply control signal VRMP.

In one embodiment of the DC-DC converter 10, the DC-DC converter 10 provides the power supply output signal PSS to a load 18. In one embodiment of the switching supply 12, the switching output voltage VS is essentially a square-wave voltage. As such, the first inductive element L1 and the filter capacitive element CF form a lowpass filter to filter the switching output voltage VS.

FIGS. 2A, 2B, 2C, and 2D are graphs illustrating the power supply control signal VRMP, the parallel amplifier output current IP, the power supply output current IO, and the power supply output voltage VSO, respectively, shown in FIG. 1 according to one embodiment of the DC-DC converter 10 (FIG. 1). In one embodiment of the load 18 (FIG. 1), the load 18 (FIG. 1) is resistive. Therefore, the power supply output current IO and the power supply output voltage VSO shown in FIGS. 2C and 2D, respectively, are shown as being in-phase with one another.

Figure 2:
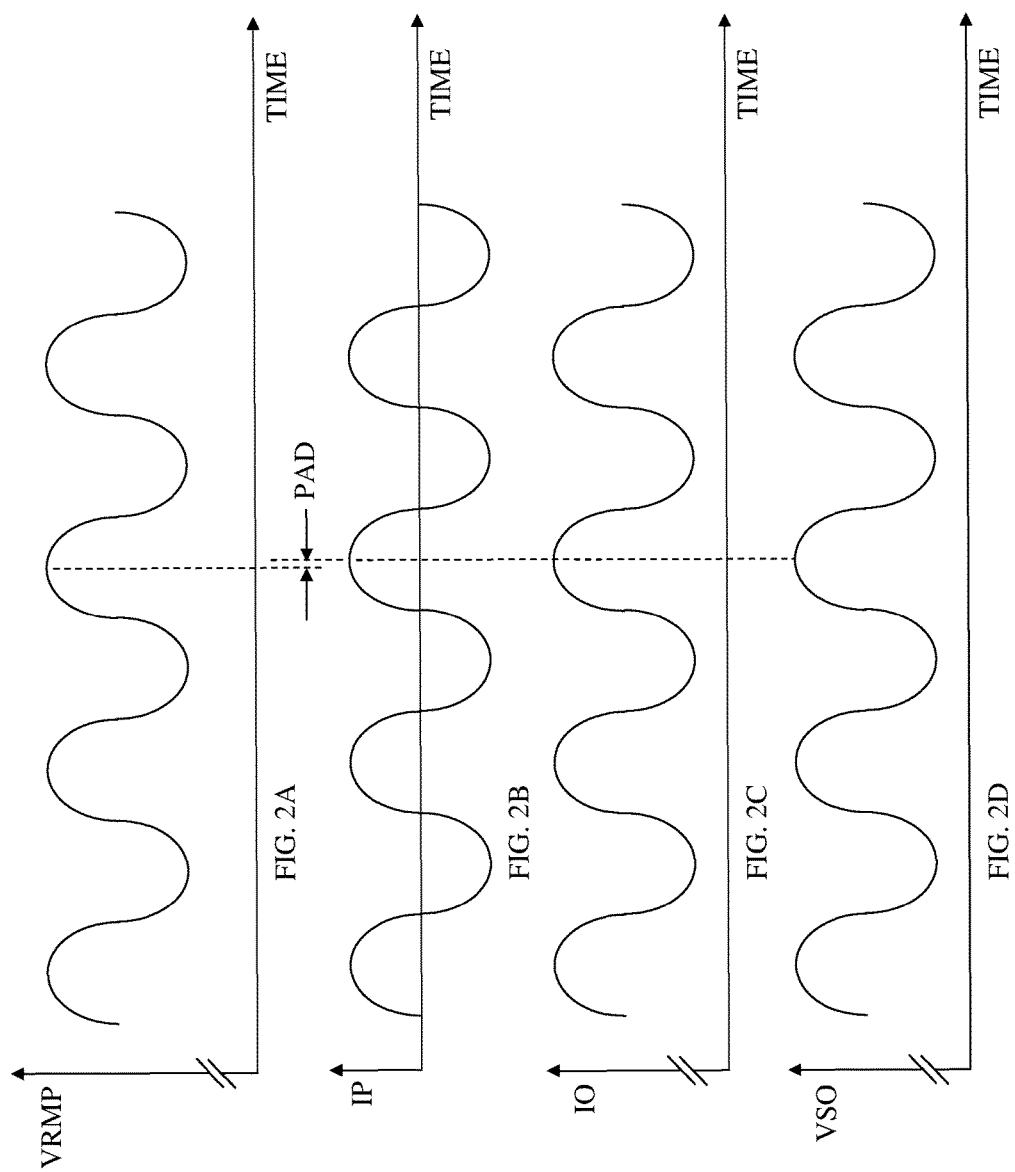
FIGS. 2A, 2B, 2C, and 2D are graphs illustrating a power supply control signal, a parallel amplifier output current, a power supply output current, and a power supply output voltage, respectively, shown in FIG. 1 according to one embodiment of the DC-DC converter.

The parallel amplifier 14 (FIG. 1) provides the parallel amplifier output current IP (FIG. 2B) based on the power supply control signal VRMP (FIG. 2A). Since the parallel amplifier 14 (FIG. 1) regulates the power supply output voltage VSO (FIG. 2D) based on the voltage setpoint of the power supply output voltage VSO (FIG. 1), as represented by the power supply control signal VRMP (FIG. 2A); and since the load 18 (FIG. 1) is resistive, the parallel amplifier output current IP (FIG. 2B) is based on the power supply control signal VRMP (FIG. 2A). However, due to latency in the parallel amplifier 14 (FIG. 1), the parallel amplifier 14 (FIG. 1) may introduce a small parallel amplifier delay PAD between the power supply control signal VRMP (FIG. 2A) and the parallel amplifier output current IP (FIG. 2B).

Figure 3:
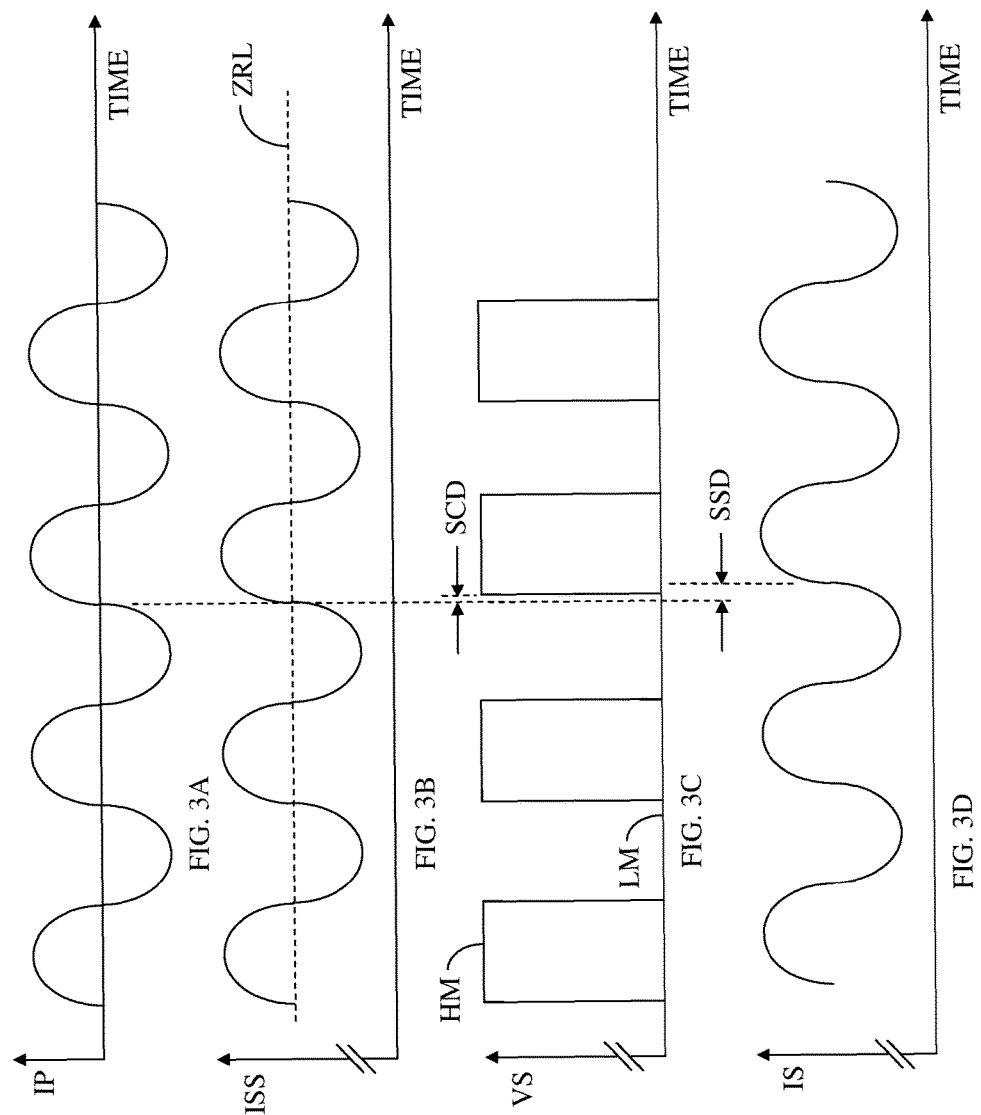
FIGS. 3A, 3B, 3C, and 3D are graphs illustrating the parallel amplifier output current, a current sense signal, a switching output voltage, and a switching supply output current, respectively, shown in FIG. 1 according to one embodiment of the DC-DC converter.

FIGS. 3A, 3B, 3C, and 3D are graphs illustrating the parallel amplifier output current IP, the current sense signal ISS, the switching output voltage VS, and the switching supply output current IS, respectively, shown in FIG. 1 according to one embodiment of the DC-DC converter 10 (FIG. 1). The parallel amplifier output current IP illustrated in FIG. 3A is similar to the parallel amplifier output current IP illustrated in FIG. 2B.

In one embodiment of the parallel amplifier 14 (FIG. 1), the parallel amplifier 14 (FIG. 1) uses the parallel amplifier output current IP (FIG. 3A) to regulate the power supply output voltage VSO (FIG. 1) based on the voltage setpoint of the power supply output voltage VSO (FIG. 1). Since the current sense signal ISS (FIG. 3B) is representative of the parallel amplifier output current IP (FIG. 3A), the current sense signal ISS (FIG. 3B) is essentially phase-aligned with the parallel amplifier output current IP (FIG. 3A).

To regulate the power supply output voltage VSO (FIG. 1), the parallel amplifier output current IP (FIG. 3A), may alternate between being both positive and negative. However, in the embodiment of the current sense signal ISS illustrated in FIG. 3B, the current sense signal ISS is always positive. As such, the current sense signal ISS is associated with a zero reference level ZRL (FIG. 3B) to discern between positive values of the parallel amplifier output current IP and negative values of the parallel amplifier output current IP.

In one embodiment of the switching output voltage VS (FIG. 3C), the switching output voltage VS (FIG. 3C) is essentially a square-wave voltage traversing between essentially ground and a positive magnitude. When the current sense signal ISS (FIG. 3B) is below the zero reference level ZRL (FIG. 3B), the switching supply 12 (FIG. 1) drives the switching output voltage VS (FIG. 3C) to be equal to a low magnitude LM. When the current sense signal ISS (FIG. 3B) is above the zero reference level ZRL (FIG. 3B), the switching supply 12 (FIG. 1) drives the switching output voltage VS (FIG. 3C) to be equal to a high magnitude HM. In one embodiment of the low magnitude LM, the low magnitude LM is essentially equal to ground. In some embodiments of the switching supply 12 (FIG. 1), the high magnitude HM may be changed according to different operating conditions. The term high magnitude HM is defined as any magnitude at least 500 millivolts greater than the low magnitude LM.

Due to latency in the switching supply 12 (FIG. 1), the switching supply 12 (FIG. 1) may introduce a switching circuitry delay SCD (FIG. 3C) between the current sense signal ISS (FIG. 3B) and the switching output voltage VS (FIG. 3C). The first inductive element L1 (FIG. 1) and the filter capacitive element CF (FIG. 1) receive and filter the switching output voltage VS (FIG. 3C) to provide the switching supply output current IS (FIG. 3D). As such, the switching supply 12 (FIG. 1) may introduce a switching supply delay SSD (FIG. 3D) between the current sense signal ISS (FIG. 3B) and the switching supply output current IS (FIG. 3D). In one embodiment of the DC-DC converter 10 (FIG. 1), the switching supply delay SSD (FIG. 3D) is significantly larger than the switching circuitry delay SCD (FIG. 3C).

Since the switching supply 12 (FIG. 1) may provide power more efficiently than the parallel amplifier 14 (FIG. 1), to maximize efficiency of the DC-DC converter 10 (FIG. 1), ideally the switching supply output current IS (FIG. 3D) would be essentially phase-aligned with the parallel amplifier output current IP (FIG. 3A). However, the switching supply delay SSD (FIG. 3D) causes a phase-shift between the parallel amplifier output current IP (FIG. 3A) and the switching supply output current IS (FIG. 3D), thereby resulting in a phase-misalignment between the parallel amplifier output current IP (FIG. 3A) and the switching supply output current IS (FIG. 3D), which may degrade efficiency of the DC-DC converter 10 (FIG. 1). As a result, there is a need to compensate for the phase-shift caused by the switching supply delay SSD (FIG. 3D).

Figure 4:
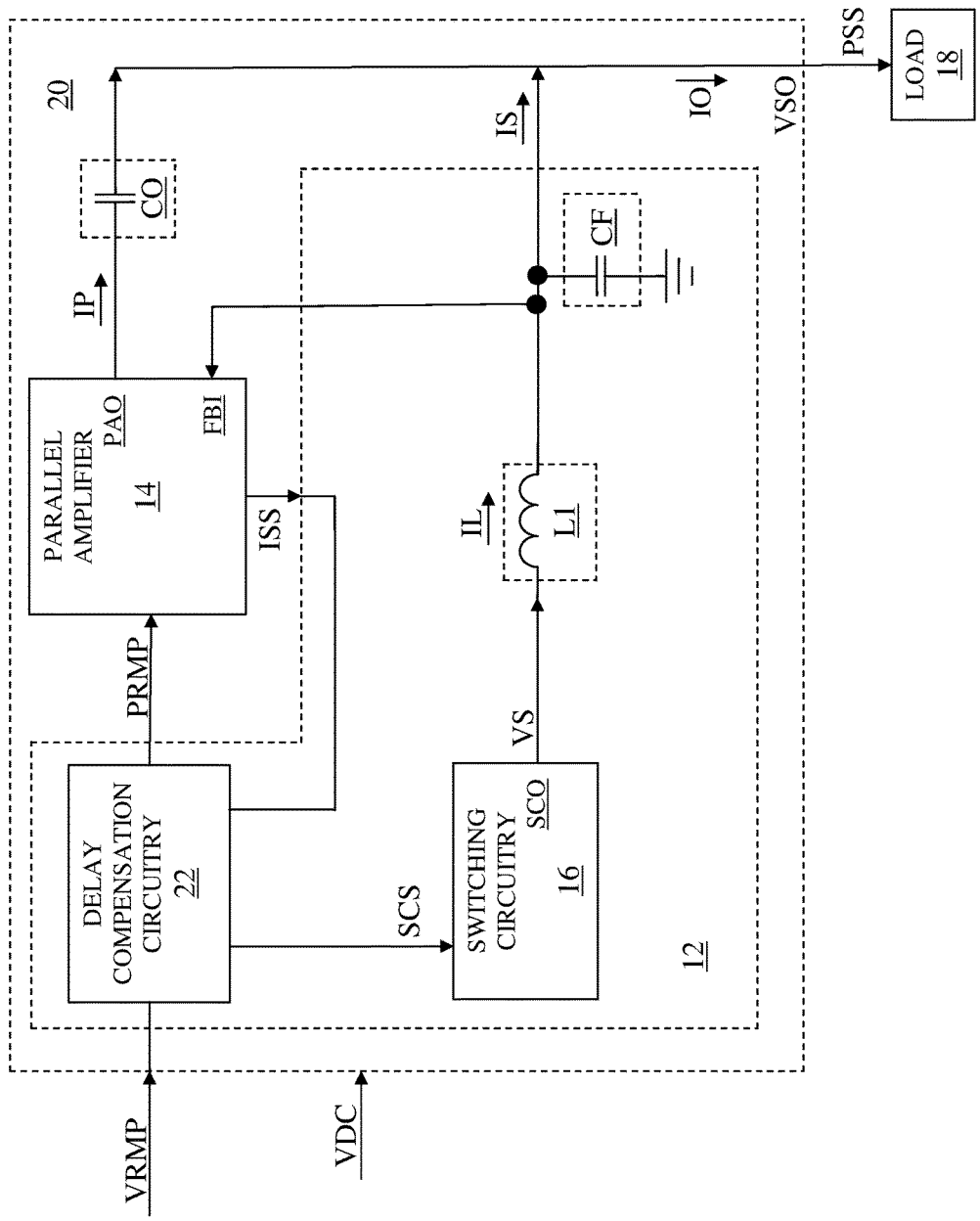
FIG. 4 shows a delay compensated DC-DC converter according to one embodiment of the delay compensated DC-DC converter.

FIG. 4 shows a delay compensated DC-DC converter 20 according to one embodiment of the delay compensated DC-DC converter 20. The delay compensated DC-DC converter 20 illustrated in FIG. 4 is similar to the DC-DC converter 10 illustrated in FIG. 1, except the delay compensated DC-DC converter 20 illustrated in FIG. 4 further includes an offset capacitive element CO coupled between the parallel amplifier output PAO and the feedback input FBI. Additionally, the switching supply 12 illustrated in FIG. 4 further includes delay compensation circuitry 22, and the parallel amplifier 14 receives a parallel amplifier control signal PRMP instead of the power supply control signal VRMP.

The delay compensation circuitry 22 receives the power supply control signal VRMP and the current sense signal ISS, and provides a switching control signal SCS to the switching circuitry 16. The switching circuitry 16 provides the switching output voltage VS based on the switching control signal SCS. In one embodiment of the delay compensation circuitry 22, the delay compensation circuitry 22 receives and delays the power supply control signal VRMP to provide the parallel amplifier control signal PRMP. In one embodiment of the delay compensation circuitry 22, the delay compensation circuitry 22 uses an analog technique to delay the power supply control signal VRMP. Such a technique may use one or more capacitive element, one or more inductive element, a delay line, the like, or any combination thereof.

In an alternate embodiment of the delay compensation circuitry 22, the delay compensation circuitry 22 uses a digital technique to delay the power supply control signal VRMP. In an additional embodiment of the delay compensation circuitry 22, the delay compensation circuitry 22 uses a combination of an analog and a digital technique to delay the power supply control signal VRMP. Such a technique could use one or more switched capacitive element used with an internally generated sampling clock at a high frequency.

Figure 5:
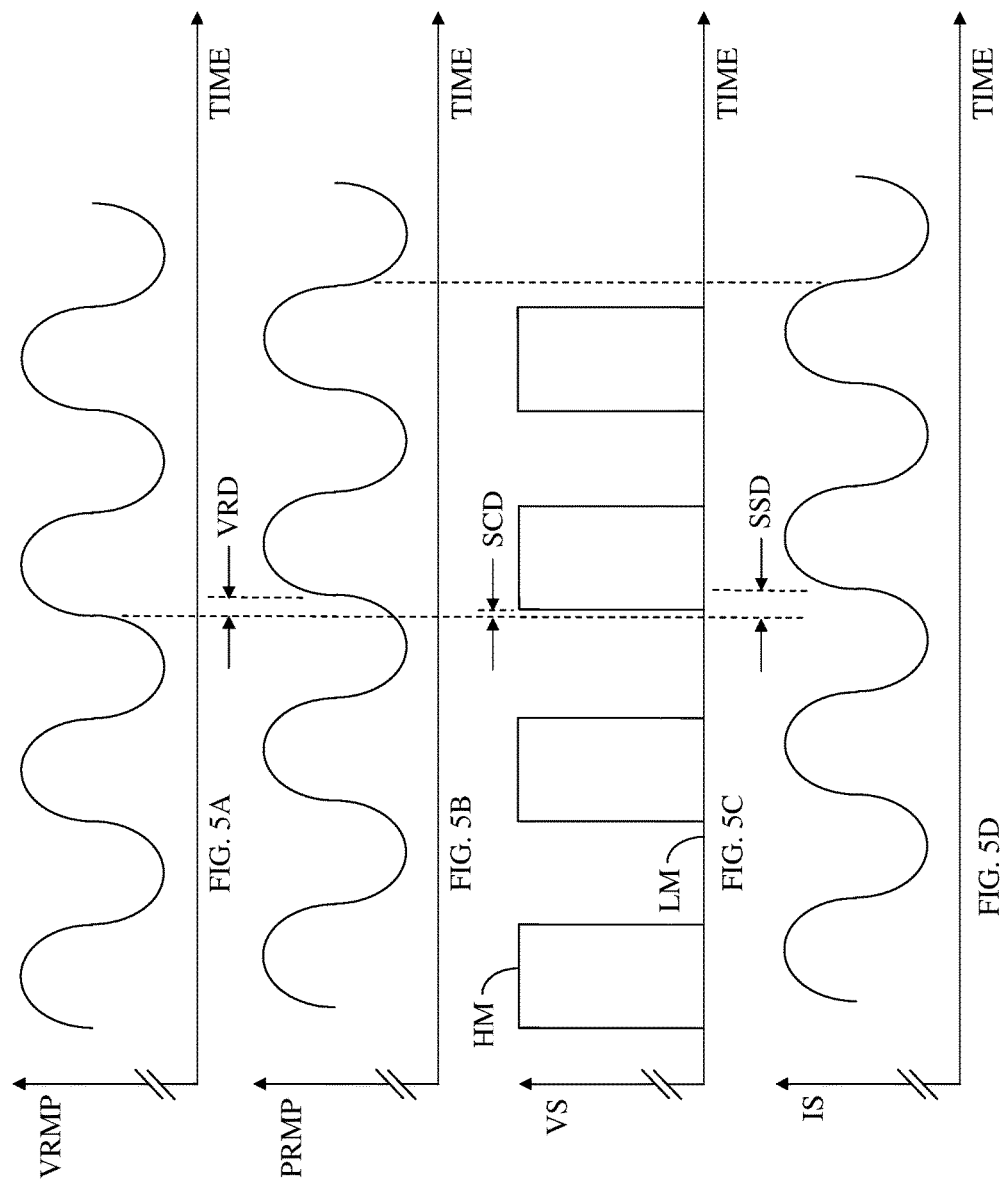
FIGS. 5A, 5B, 5C, and 5D are graphs illustrating the power supply control signal, a parallel amplifier control signal, the switching output voltage, and the switching supply output current, respectively, shown in FIG. 4 according to one embodiment of the power supply control signal, the parallel amplifier control signal, the switching output voltage, and the switching supply output current.

The parallel amplifier control signal PRMP is delayed from the power supply control signal VRMP by a control signal delay VRD, as shown in FIGS. 5A and 5B. The parallel amplifier 14 regulates the power supply output voltage VSO using the parallel amplifier control signal PRMP, which is representative of the voltage setpoint of the power supply output voltage VSO.

The delay compensation circuitry 22 uses the power supply control signal VRMP and the current sense signal ISS to provide the switching control signal SCS. As such, the switching output voltage VS occurs earlier than the parallel amplifier control signal PRMP, thereby at least partially compensating for the switching supply delay SSD (FIG. 3D). Notably, by delaying the parallel amplifier 14, other system circuits may need to be adjusted for proper operation.

In general, in one embodiment of the switching supply 12, the switching supply 12 makes an early determination of the switching output voltage VS using the current sense signal ISS and the power supply control signal VRMP to at least partially compensate for delay in the switching supply 12. In one embodiment of the switching supply 12, at least part of the delay in the switching supply 12 is based on the first inductive element L1. In one embodiment of the switching supply 12, at least part of the delay in the switching supply 12 is based on the first inductive element L1 and at least part of the delay in the switching supply 12 is further based on the filter capacitive element CF.

The parallel amplifier 14 partially provides the power supply output signal PSS via the parallel amplifier output PAO and the offset capacitive element CO based on the voltage setpoint of the power supply output voltage VSO. The offset capacitive element CO allows the power supply output voltage VSO to be higher than a voltage at the parallel amplifier output PAO. As a result, the parallel amplifier 14 may properly regulate the power supply output voltage VSO even if the power supply output voltage VSO is greater than a maximum output voltage from the parallel amplifier 14 at the parallel amplifier output PAO. In the embodiment of the delay compensated DC-DC converter 20 illustrated in FIG. 4, the filter capacitive element CF is coupled between the parallel amplifier output PAO and the ground through the offset capacitive element CO. In an alternate embodiment of the delay compensated DC-DC converter 20, the offset capacitive element CO is omitted.

FIGS. 5A, 5B, 5C, and 5D are graphs illustrating the power supply control signal VRMP, the parallel amplifier control signal PRMP, the switching output voltage VS, and the switching supply output current IS, respectively, shown in FIG. 4 according to one embodiment of the delay compensated DC-DC converter 20 (FIG. 4). The power supply control signal VRMP illustrated in FIG. 5A is similar to the power supply control signal VRMP illustrated in FIG. 2A. The switching output voltage VS illustrated in FIG. 5C is similar to the switching output voltage VS illustrated in FIG. 3C. The switching supply output current IS illustrated in FIG. 5D is similar to the switching supply output current IS illustrated in FIG. 3D. As such, the timing relationships between the power supply control signal VRMP, the switching output voltage VS, and the switching supply output current IS illustrated in FIGS. 5A, 5C, and 5D, respectively, are similar to the timing relationships between the power supply control signal VRMP, the switching output voltage VS, and the switching supply output current IS illustrated in FIGS. 2A, 3C, and 3D, respectively.

The parallel amplifier 14 (FIG. 4) regulates the power supply output voltage VSO (FIG. 4) based on the voltage setpoint of the power supply output voltage VSO (FIG. 4). However, in the delay compensated DC-DC converter 20 (FIG. 4), the voltage setpoint of the power supply output voltage VSO (FIG. 4) is based on the parallel amplifier control signal PRMP (FIG. 5B) instead of being based on the power supply control signal VRMP (FIG. 5A), as illustrated in FIG. 1.

Further, since the parallel amplifier control signal PRMP (FIG. 5B) is delayed from the power supply control signal VRMP (FIG. 5A) by the control signal delay VRD, a phase-misalignment between the parallel amplifier control signal PRMP (FIG. 5B) and the switching output voltage VS (FIG. 5C) is less than a phase-misalignment between the power supply control signal VRMP (FIG. 5A) and the switching output voltage VS (FIG. 5C). Since the parallel amplifier 14 (FIG. 4) provides the parallel amplifier output current IP (FIG. 4) based on the parallel amplifier control signal PRMP (FIGS. 4 and 5B) instead of being based on the power supply control signal VRMP (FIGS. 1 and 5A), the phase-misalignment between the parallel amplifier output current IP (FIG. 4) and the switching supply output current IS (FIG. 4) is reduced, thereby increasing efficiency of the delay compensated DC-DC converter 20 compared with the efficiency of the DC-DC converter 10 (FIG. 1).

Figure 6:
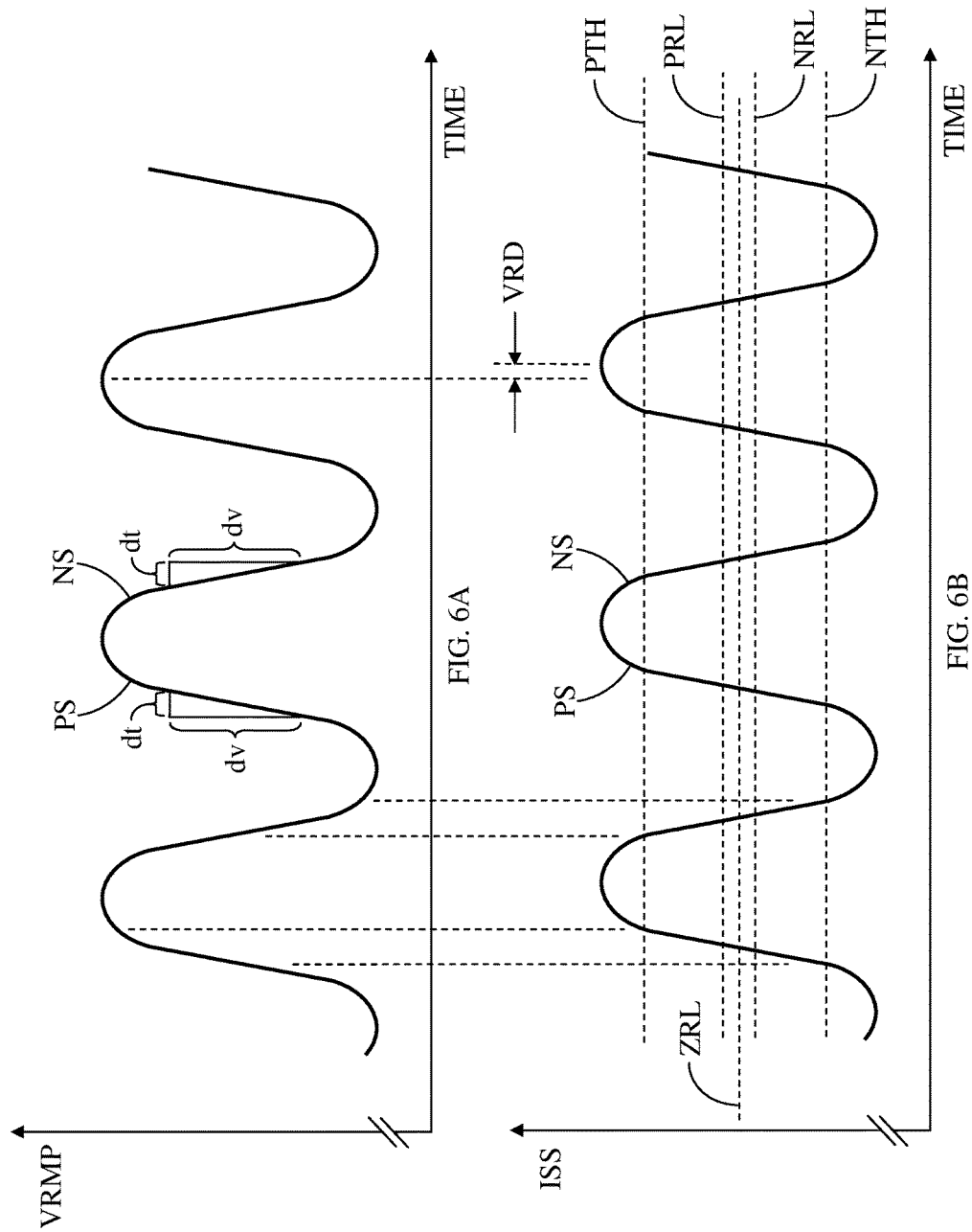
FIGS. 6A and 6B are graphs illustrating the power supply control signal and the current sense signal, respectively, shown in FIG. 4 according to one embodiment of the power supply control signal and the current sense signal.

FIGS. 6A and 6B are graphs illustrating the power supply control signal VRMP and the current sense signal ISS, respectively, shown in FIG. 4 according to one embodiment of the delay compensated DC-DC converter 20 (FIG. 4). Since the parallel amplifier control signal PRMP (FIG. 5B) is delayed from the power supply control signal VRMP (FIG. 5A) by the control signal delay VRD (FIGS. 5A and 5B), the current sense signal ISS is delayed from the power supply control signal VRMP by approximately the control signal delay VRD.

The power supply control signal VRMP has a positive slope PS when a time-rate-of-change (dv/dt) of the power supply control signal VRMP is positive. Conversely, the power supply control signal VRMP has a negative slope NS when the time-rate-of-change (dv/dt) of the power supply control signal VRMP is negative. Similarly, the current sense signal ISS has a positive slope PS when a time-rate-of-change (dv/dt) of the current sense signal ISS is positive. Conversely, the current sense signal ISS has a negative slope NS when the time-rate-of-change (dv/dt) of the current sense signal ISS is negative. The current sense signal ISS illustrated in FIG. 6B is associated with any or all of a positive threshold PTH, a positive reference level PRL, the zero reference level ZRL, a negative reference level NRL, and a negative threshold NTH.

In one embodiment of the delay compensated DC-DC converter 20 (FIG. 4), when the magnitude of the current sense signal ISS is greater than the zero reference level ZRL, the switching supply 12 (FIG. 4) drives the switching output voltage VS (FIG. 5C) to the high magnitude HM (FIG. 5C). Further, when the magnitude of the current sense signal ISS is less than the zero reference level ZRL, the switching supply 12 (FIG. 4) drives the switching output voltage VS (FIG. 5C) to the low magnitude LM (FIG. 5C).

However, to further compensate for the control signal delay VRD (FIGS. 5A and 5B), in one embodiment of the delay compensated DC-DC converter 20 (FIG. 4), when the current sense signal ISS has a positive time-rate-of-change, when the magnitude of the current sense signal ISS is greater than the negative threshold NTH, when a sum of the magnitude of the current sense signal ISS and a time-rate-of-change of the power supply control signal VRMP is greater than the positive reference level PRL, the switching supply 12 (FIG. 4) drives the switching output voltage VS (FIG. 5C) to the high magnitude HM (FIG. 5C).

Additionally, in one embodiment of the delay compensated DC-DC converter 20 (FIG. 4), when the current sense signal ISS has a negative time-rate-of-change, when the magnitude of the current sense signal ISS is less than the positive threshold PTH, when the sum of the magnitude of the current sense signal ISS and the time-rate-of-change of the power supply control signal VRMP is less than the negative reference level NRL, the switching supply 12 (FIG. 4) drives the switching output voltage VS (FIG. 5C) to the low magnitude LM (FIG. 5C). In this regard, when the current sense signal ISS has the negative time-rate-of-change, the power supply control signal VRMP may also have a negative time-rate-of-change.

To further compensate for the control signal delay VRD (FIGS. 5A and 5B), in an alternate embodiment of the delay compensated DC-DC converter 20 (FIG. 4), when the current sense signal ISS has a positive time-rate-of-change, when the sum of the magnitude of the current sense signal ISS and the time-rate-of-change of the power supply control signal VRMP is greater than the positive reference level PRL, the switching supply 12 (FIG. 4) drives the switching output voltage VS (FIG. 5C) to the high magnitude HM (FIG. 5C).

Additionally, in an alternate embodiment of the delay compensated DC-DC converter 20 (FIG. 4), when the current sense signal ISS has a negative time-rate-of-change, when the sum of the magnitude of the current sense signal ISS and the time-rate-of-change of the power supply control signal VRMP is less than the negative reference level NRL, the switching supply 12 (FIG. 4) drives the switching output voltage VS (FIG. 5C) to the low magnitude LM (FIG. 5C). In this regard, when the current sense signal ISS has the negative time-rate-of-change, the power supply control signal VRMP may also have a negative time-rate-of-change.

To further compensate for the control signal delay VRD (FIGS. 5A and 5B), in an additional embodiment of the delay compensated DC-DC converter 20 (FIG. 4), when the current sense signal ISS has a positive time-rate-of-change, when the sum of the magnitude of the current sense signal ISS and the time-rate-of-change of the power supply control signal VRMP is greater than the zero reference level ZRL, the switching supply 12 (FIG. 4) drives the switching output voltage VS (FIG. 5C) to the high magnitude HM (FIG. 5C).

Additionally, in an additional embodiment of the delay compensated DC-DC converter 20 (FIG. 4), when the current sense signal ISS has a negative time-rate-of-change, when the sum of the magnitude of the current sense signal ISS and the time-rate-of-change of the power supply control signal VRMP is less than the zero reference level ZRL, the switching supply 12 (FIG. 4) drives the switching output voltage VS (FIG. 5C) to the low magnitude LM (FIG. 5C). In this regard, when the current sense signal ISS has the negative time-rate-of-change, the power supply control signal VRMP may also have a negative time-rate-of-change.

Figure 7:
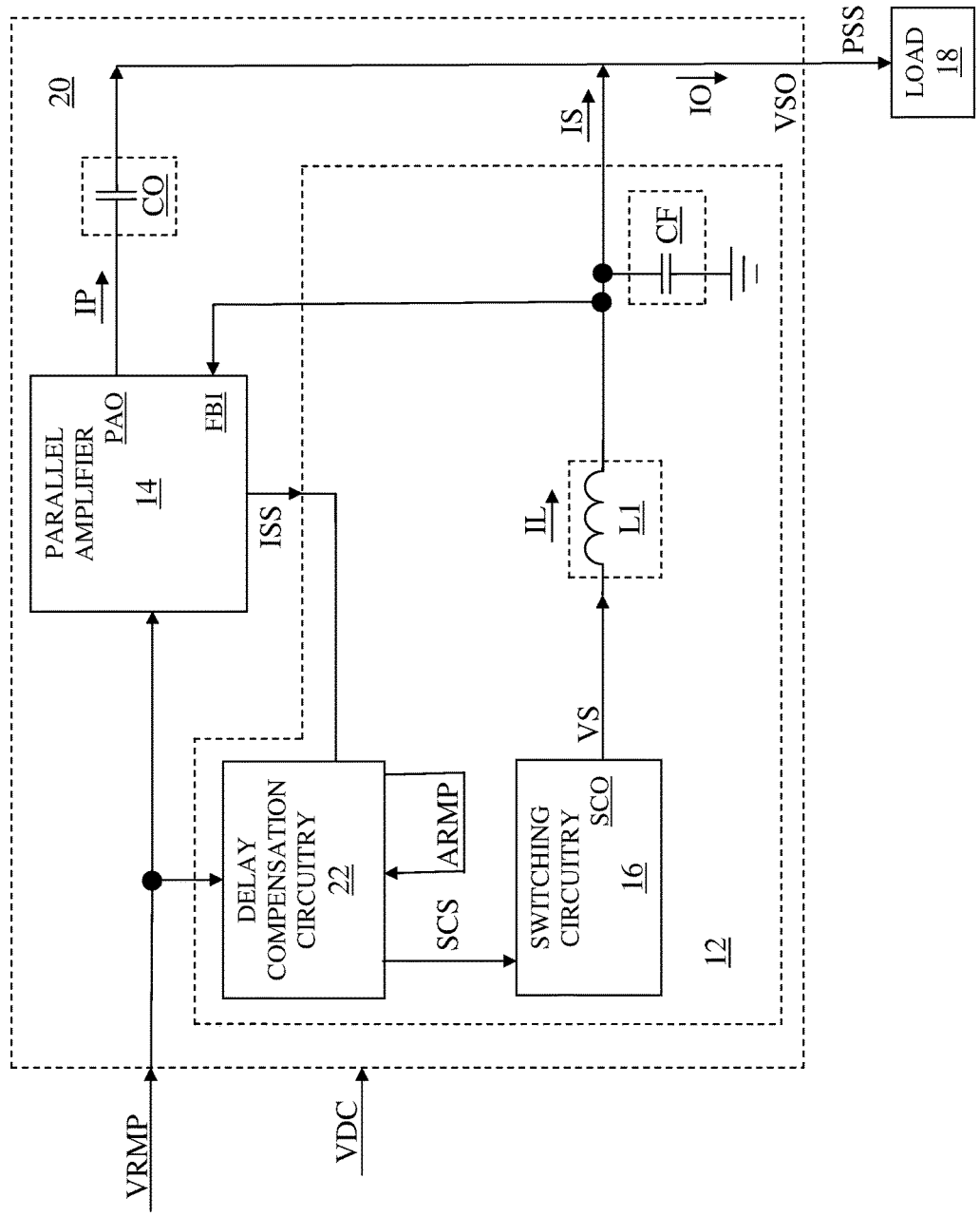
FIG. 7 shows the delay compensated DC-DC converter according to an alternate embodiment of the delay compensated DC-DC converter.

FIG. 7 shows the delay compensated DC-DC converter 20 according to an alternate embodiment of the delay compensated DC-DC converter 20. The delay compensated DC-DC converter 20 illustrated in FIG. 7 is similar to the delay compensated DC-DC converter 20 illustrated in FIG. 4, except in the delay compensated DC-DC converter 20 illustrated in FIG. 7, the parallel amplifier 14 receives the power supply control signal VRMP instead of the parallel amplifier control signal PRMP (FIG. 4). As such, the delay compensation circuitry 22 uses the power supply control signal VRMP to generate an advanced power supply control signal ARMP.

Figure 8:
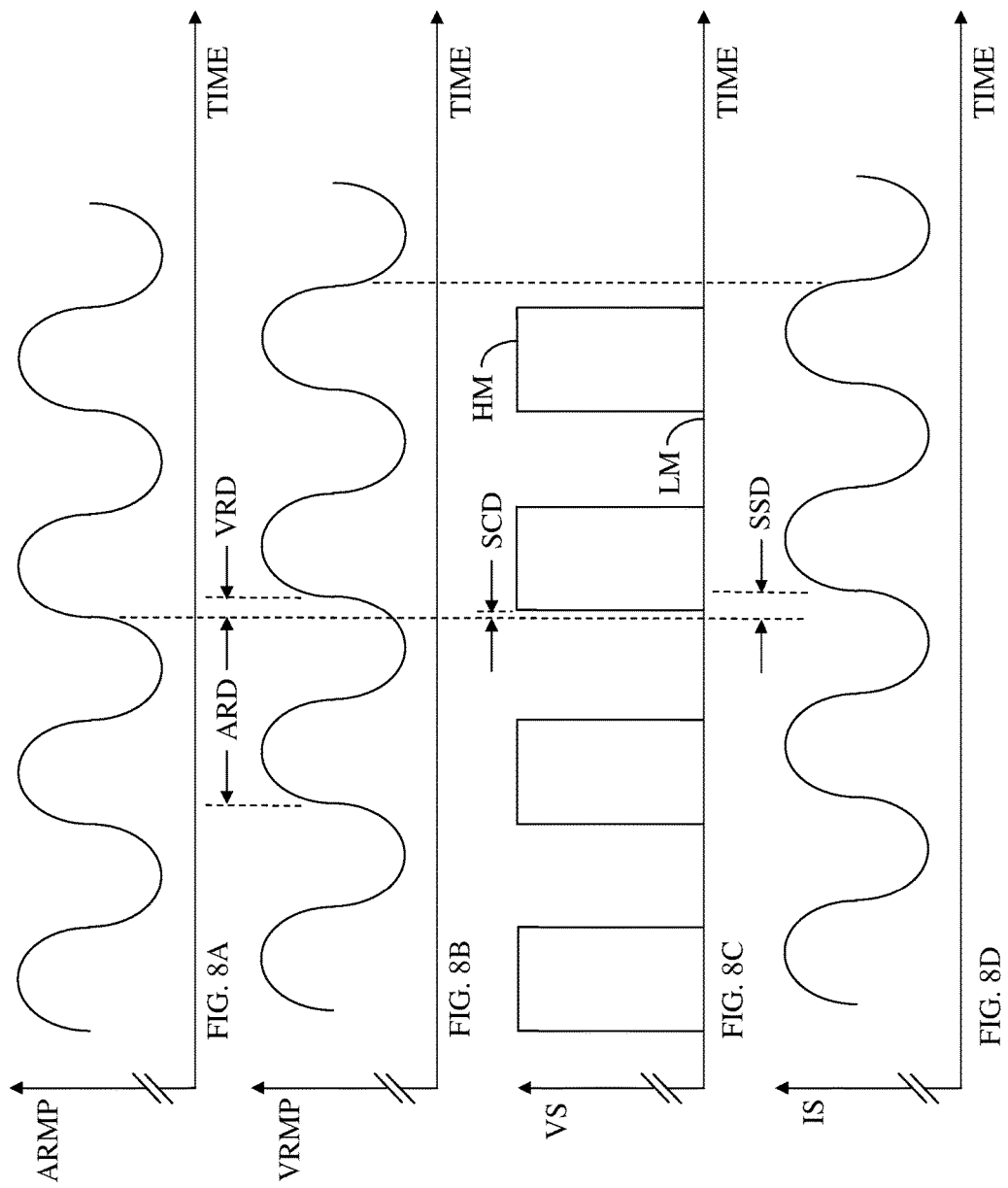
FIGS. 8A, 8B, 8C, and 8D are graphs illustrating an advanced power supply control signal, the power supply control signal, the switching output voltage, and the switching supply output current, respectively, shown in FIG. 7 according to one embodiment of the advanced power supply control signal, the power supply control signal, the switching output voltage, and the switching supply output current.

The power supply control signal VRMP is delayed from the advanced power supply control signal ARMP by the control signal delay VRD, as illustrated in FIGS. 8A and 8B. In this regard, operational timing of the switching supply 12 illustrated in FIG. 7 is based on the advanced power supply control signal ARMP, whereas operational timing of the switching supply 12 illustrated in FIG. 4 is based on the power supply control signal VRMP. Further, operational timing of the parallel amplifier 14 illustrated in FIG. 7 is based on the power supply control signal VRMP, whereas operational timing of the parallel amplifier 14 illustrated in FIG. 4 is based on the parallel amplifier control signal PRMP (FIG. 4).

As such, FIGS. 8A, 8B, 8C, and 8D are graphs illustrating the advanced power supply control signal ARMP, the power supply control signal VRMP, the switching output voltage VS, and the switching supply output current IS, respectively, shown in FIG. 7 according to one embodiment of the delay compensated DC-DC converter 20 (FIG. 7).

The delay compensation circuitry 22 (FIG. 7) uses the power supply control signal VRMP (FIG. 8B) to generate the advanced power supply control signal ARMP (FIG. 8A). By applying an advanced control signal delay ARD (FIGS. 8A and 8B) to an early cycle of the power supply control signal VRMP (FIG. 8B), the delay compensation circuitry 22 (FIG. 7) provides the advanced power supply control signal ARMP (FIG. 8A), such that the power supply control signal VRMP (FIG. 8B) is delayed from the advanced power supply control signal ARMP (FIG. 8A) by the control signal delay VRD (FIGS. 8A and 8B).

Timing of the switching output voltage VS (FIG. 8C) and the switching supply output current IS (FIG. 8D) relative to the timing of the advanced power supply control signal ARMP (FIG. 8A) is similar to the timing of the switching output voltage VS (FIG. 5C) and the switching supply output current IS (FIG. 5D) relative to the timing of the power supply control signal VRMP (FIG. 5A). Additionally, timing of the power supply control signal VRMP (FIG. 8B) relative to the timing of the advanced power supply control signal ARMP (FIG. 8A) is similar to the timing of the parallel amplifier control signal PRMP (FIG. 5B) relative to the timing of the power supply control signal VRMP (FIG. 5A).

Figure 9:
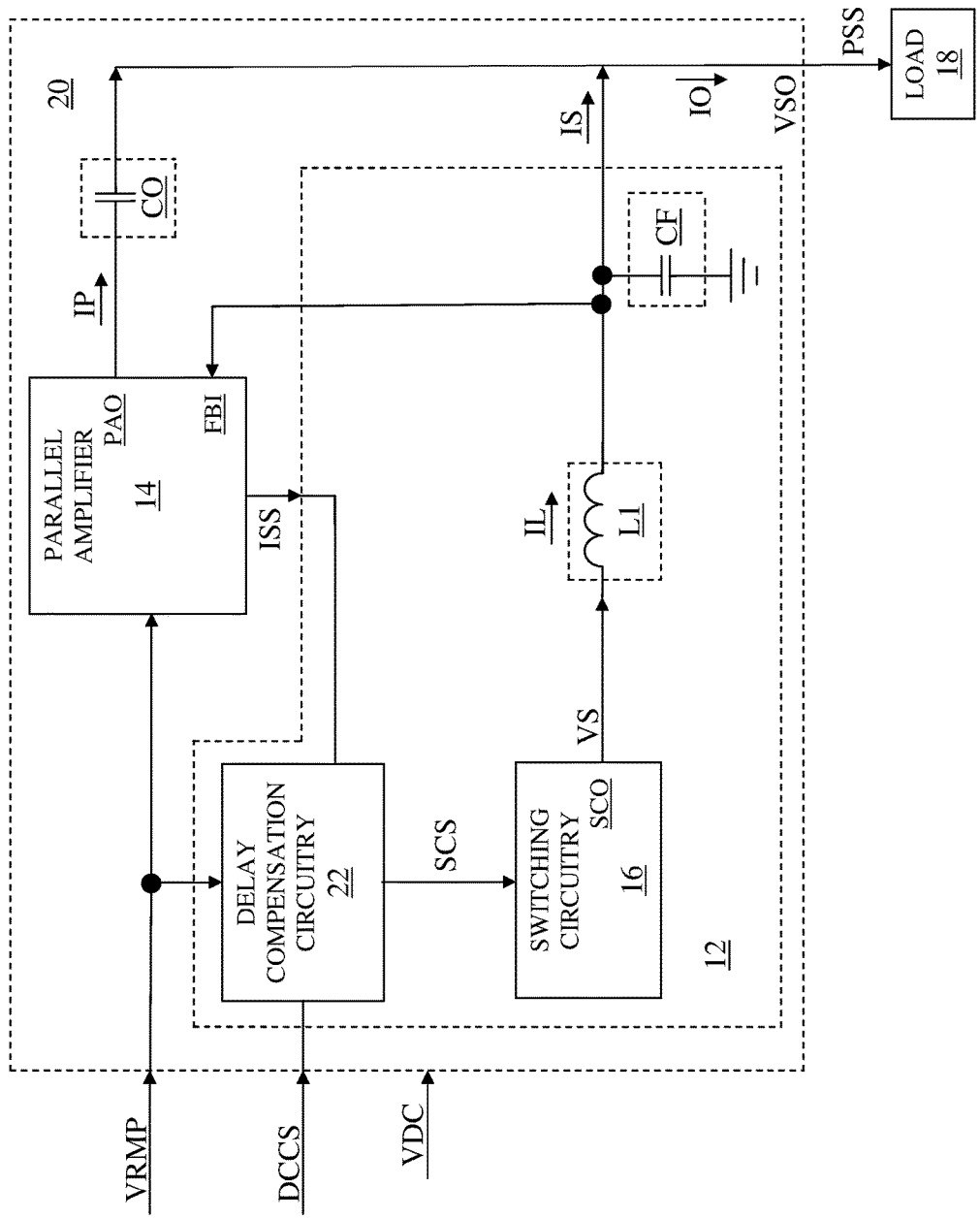
FIG. 9 shows the delay compensated DC-DC converter according to an additional embodiment of the delay compensated DC-DC converter.

FIG. 9 shows the delay compensated DC-DC converter 20 according to an additional embodiment of the delay compensated DC-DC converter 20. The delay compensated DC-DC converter 20 illustrated in FIG. 9 is similar to the delay compensated DC-DC converter 20 illustrated in FIG. 7, except in the delay compensated DC-DC converter 20 illustrated in FIG. 9, the advanced power supply control signal ARMP is omitted, and the delay compensation circuitry 22 receives a DC-DC converter compensation signal DCCS.

The DC-DC converter compensation signal DCCS is provided from a source external to the delay compensated DC-DC converter 20, such that the DC-DC converter compensation signal DCCS provides timing information that is similar to the timing information provided by the advanced power supply control signal ARMP (FIG. 7). In one embodiment of the switching supply 12, the switching supply 12 makes the early determination of the switching output voltage VS using the current sense signal ISS, the power supply control signal VRMP, and the DC-DC converter compensation signal DCCS to at least partially compensate for delay in the switching supply 12.

Figure 10:
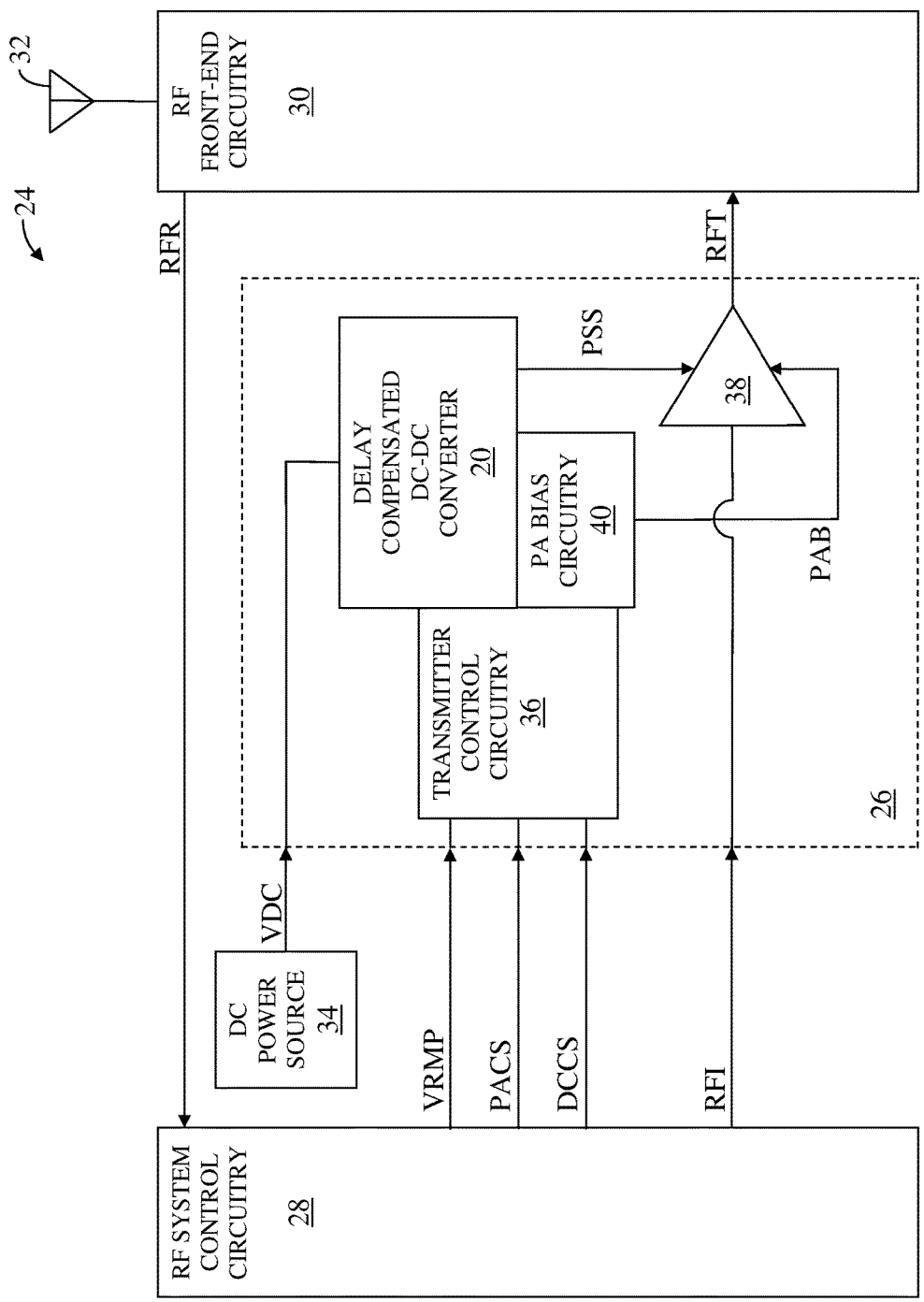
FIG. 10 shows a radio frequency (RF) communications system according to one embodiment of the present disclosure.

FIG. 10 shows a radio frequency (RF) communications system 24 according to one embodiment of the present disclosure. The RF communications system 24 includes RF transmitter circuitry 26, RF system control circuitry 28, RF front-end circuitry 30, an RF antenna 32, and a DC power source 34. The RF transmitter circuitry 26 includes transmitter control circuitry 36, an RF power amplifier (PA) 38, the delay compensated DC-DC converter 20, and PA bias circuitry 40. The delay compensated DC-DC converter 20 functions as an envelope tracking power supply. In an alternate embodiment of the RF communications system 24, the DC power source 34 is external to the RF communications system 24. In one embodiment of the switching supply 12 (FIG. 4), the switching supply 12 (FIG. 4) drives the parallel amplifier output current IP (FIG. 4) toward zero using the switching output voltage VS (FIG. 4) to increase efficiency of the RF transmitter circuitry 26 in particular and of the RF communications system 24 in general.

In one embodiment of the RF communications system 24, the RF front-end circuitry 30 receives via the RF antenna 32, processes, and forwards an RF receive signal RFR to the RF system control circuitry 28. In one embodiment of the RF communications system 24, the RF receive signal RFR has an RF receive frequency. The RF system control circuitry 28 provides the power supply control signal VRMP, a transmitter configuration signal PACS, and the DC-DC converter compensation signal DCCS to the transmitter control circuitry 36. In an alternate embodiment of the RF communications system 24, the DC-DC converter compensation signal DCCS is omitted. The RF system control circuitry 28 provides an RF input signal RFI to the RF PA 38. The DC power source 34 provides a DC source signal VDC to the delay compensated DC-DC converter 20. In one embodiment of the DC power source 34, the DC power source 34 is a battery. In one embodiment of the power supply control signal VRMP, the power supply control signal VRMP is an envelope power supply control signal. Specifically, the DC power source 34 provides the DC source signal VDC to the parallel amplifier 14 (FIG. 1) and to the switching supply 12 (FIG. 1).

The transmitter control circuitry 36 is coupled to the delay compensated DC-DC converter 20 and to the PA bias circuitry 40. The delay compensated DC-DC converter 20 provides the power supply output signal PSS to the RF PA 38 based on the power supply control signal VRMP. In this regard, the delay compensated DC-DC converter 20 is an envelope tracking power supply and the power supply output signal PSS is an envelope power supply signal. The DC source signal VDC provides power to the delay compensated DC-DC converter 20. As such, the power supply output signal PSS, which is the envelope power supply signal, is based on the DC source signal VDC. The power supply control signal VRMP is representative of a voltage setpoint of the envelope power supply signal. The RF PA 38 receives and amplifies the RF input signal RFI to provide an RF transmit signal RFT using the power supply output signal PSS. The power supply output signal PSS provides power for amplification to the RF PA 38. In one embodiment of the delay compensated DC-DC converter 20, the power supply output signal PSS is amplitude modulated to at least partially provide envelope tracking.

In a first embodiment of the power supply output signal PSS, a bandwidth of the power supply output signal PSS is greater than or equal to about 10 megahertz. In a second embodiment of the power supply output signal PSS, a bandwidth of the power supply output signal PSS is less than or equal to about 10 megahertz. In a third embodiment of the power supply output signal PSS, a bandwidth of the power supply output signal PSS is greater than or equal to about 20 megahertz. In a fourth embodiment of the power supply output signal PSS, a bandwidth of the power supply output signal PSS is less than or equal to about 20 megahertz.

The RF front-end circuitry 30 receives, processes, and transmits the RF transmit signal RFT via the RF antenna 32. In one embodiment of the RF transmitter circuitry 26, the transmitter control circuitry 36 configures the RF transmitter circuitry 26 based on the transmitter configuration signal PACS. In one embodiment of the RF transmitter circuitry 26, the transmitter control circuitry 36 forwards the DC-DC converter compensation signal DCCS to the delay compensated DC-DC converter 20. In one embodiment of the RF communications system 24, the RF communications system 24 operates in a full duplex environment, such that the RF transmit signal RFT and the RF receive signal RFR may be active simultaneously. The RF transmit signal RFT has an RF transmit frequency and the RF receive signal RFR has the RF receive frequency. A difference between the RF transmit frequency and the RF receive frequency is about equal to an RF duplex frequency.

The PA bias circuitry 40 provides a PA bias signal PAB to the RF PA 38. In this regard, the PA bias circuitry 40 biases the RF PA 38 via the PA bias signal PAB. In one embodiment of the PA bias circuitry 40, the PA bias circuitry 40 biases the RF PA 38 based on the transmitter configuration signal PACS. In one embodiment of the RF front-end circuitry 30, the RF front-end circuitry 30 includes at least one RF switch, at least one RF amplifier, at least one RF filter, at least one RF duplexer, at least one RF diplexer, at least one RF amplifier, the like, or any combination thereof. In one embodiment of the RF system control circuitry 28, the RF system control circuitry 28 is RF transceiver circuitry, which may include an RF transceiver IC, baseband controller circuitry, the like, or any combination thereof. In one embodiment of the RF transmitter circuitry 26, the delay compensated DC-DC converter 20 provides the power supply output signal PSS. In one embodiment of the RF transmitter circuitry 26, the power supply output signal PSS provides power for amplification and at least partially envelope tracks the RF transmit signal RFT.

Figure 11:
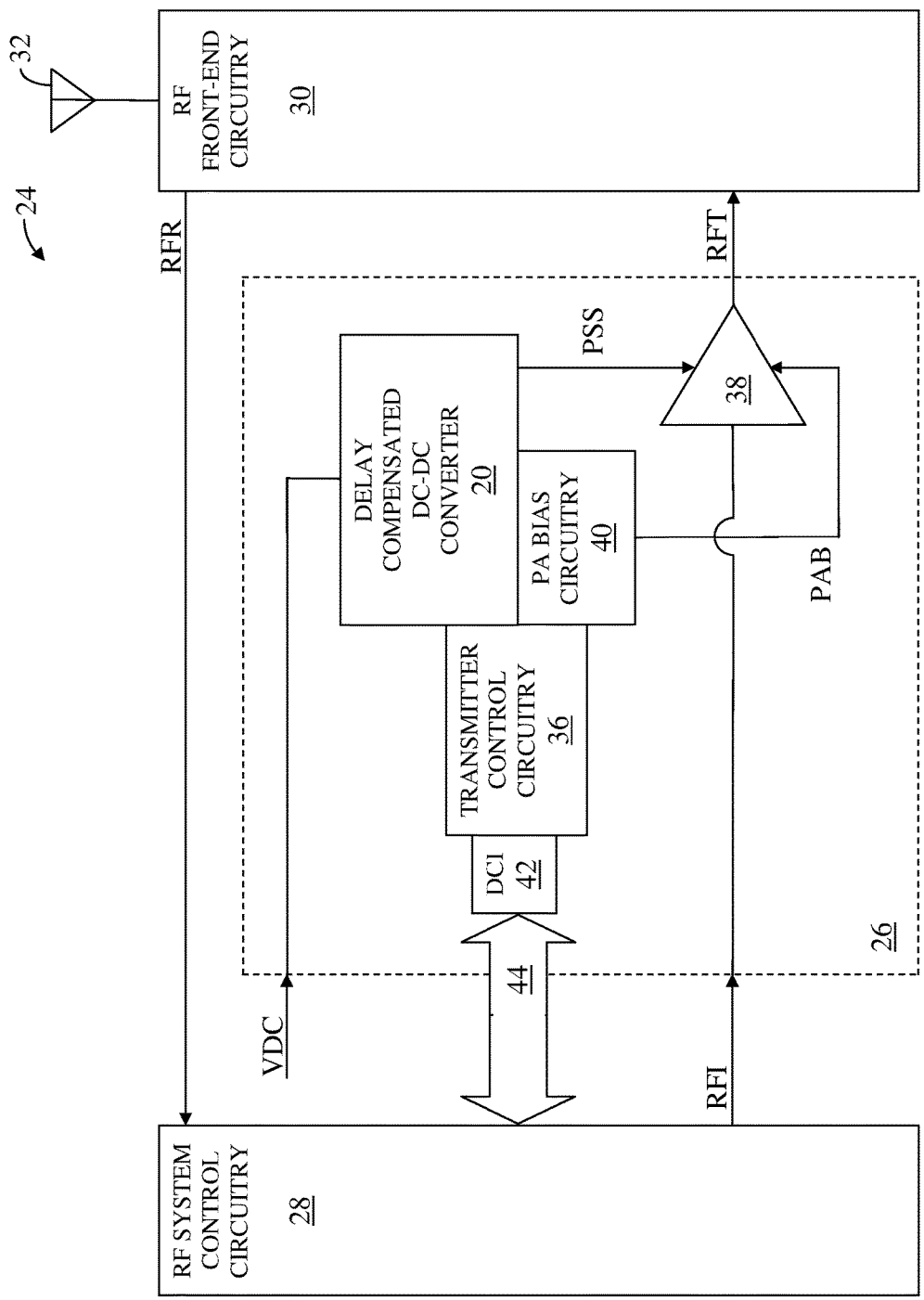
FIG. 11 shows the RF communications system according to an alternate embodiment of the RF communications system.

FIG. 11 shows the RF communications system 24 according to an alternate embodiment of the RF communications system 24. The RF communications system 24 illustrated in FIG. 11 is similar to the RF communications system 24 illustrated in FIG. 10, except in the RF communications system 24 illustrated in FIG. 11, the RF transmitter circuitry 26 further includes a digital communications interface 42, which is coupled between the transmitter control circuitry 36 and a digital communications bus 44. The digital communications bus 44 is also coupled to the RF system control circuitry 28. As such, the RF system control circuitry 28 provides the power supply control signal VRMP (FIG. 10), the transmitter configuration signal PACS (FIG. 10), and the DC-DC converter compensation signal DCCS (FIG. 10) to the transmitter control circuitry 36 via the digital communications bus 44 and the digital communications interface 42.

Figure 12:
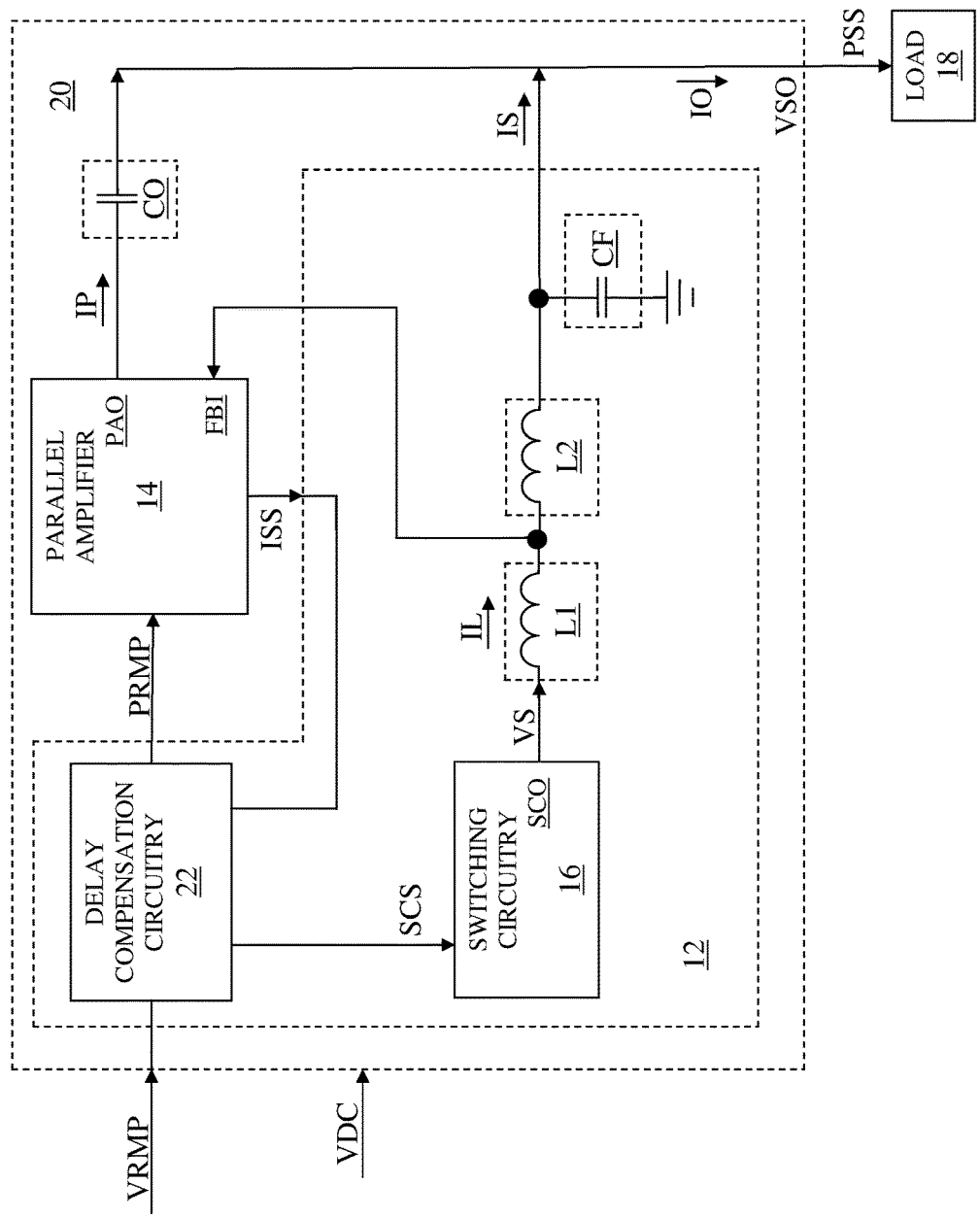
FIG. 12 shows the delay compensated DC-DC converter according to one embodiment of the delay compensated DC-DC converter.

FIG. 12 shows the delay compensated DC-DC converter 20 according to one embodiment of the delay compensated DC-DC converter 20. The delay compensated DC-DC converter 20 illustrated in FIG. 12 is similar to the delay compensated DC-DC converter 20 illustrated in FIG. 4, except in the delay compensated DC-DC converter 20 illustrated in FIG. 12, the switching supply 12 further includes a second inductive element L2. The second inductive element L2 and the offset capacitive element CO are coupled in series between the feedback input FBI and the parallel amplifier output PAO. In an alternate embodiment of the delay compensated DC-DC converter 20, the offset capacitive element CO is omitted, such that the second inductive element L2 is directly coupled between the feedback input FBI and the parallel amplifier output PAO.

The switching supply 12 partially provides the power supply output signal PSS via the first inductive element L1 and the second inductive element L2. In one embodiment of the parallel amplifier 14, the parallel amplifier 14 has a limited open loop gain at high frequencies that are above a frequency threshold. At such frequencies, a group delay in the parallel amplifier 14 may normally limit the ability of the parallel amplifier 14 to accurately regulate the power supply output voltage VSO of the power supply output signal PSS. However, by feeding back a voltage at a junction of the first inductive element L1 and the second inductive element L2 to the feedback input FBI instead of the power supply output voltage VSO, a phase-shift that is developed across the second inductive element L2 at least partially compensates for the limited open loop gain of the parallel amplifier 14 at frequencies that are above the frequency threshold, thereby improving the ability of the parallel amplifier 14 to accurately regulate the power supply output voltage VSO.

In this regard, in one embodiment of the delay compensated DC-DC converter 20, the parallel amplifier 14 partially provides the power supply output signal PSS via the parallel amplifier output PAO based on the voltage setpoint and feeding back a voltage to the feedback input FBI from a junction between the first inductive element L1 and the second inductive element L2.

Some of the circuitry previously described may use discrete circuitry, integrated circuitry, programmable circuitry, non-volatile circuitry, volatile circuitry, software executing instructions on computing hardware, firmware executing instructions on computing hardware, the like, or any combination thereof. The computing hardware may include mainframes, micro-processors, micro-controllers, DSPs, the like, or any combination thereof.

None of the embodiments of the present disclosure are intended to limit the scope of any other embodiment of the present disclosure. Any or all of any embodiment of the present disclosure may be combined with any or all of any other embodiment of the present disclosure to create new embodiments of the present disclosure.

Those skilled in the art will recognize improvements and modifications to the embodiments of the present disclosure. All such improvements and modifications are considered within the scope of the concepts disclosed herein and the claims that follow.

What is claimed is:
1. Circuitry comprising:
   a parallel amplifier configured to:
      regulate a power supply output voltage based on a power supply control signal; and provide a current sense signal, which is representative of a parallel amplifier output current from the parallel amplifier;
a switching supply coupled to the parallel amplifier and configured to:
provide a switching output voltage;
make an early determination of the switching output voltage using the current sense signal and the power supply control signal to at least partially compensate for delay in the switching supply; and
drive the parallel amplifier output current toward zero using the switching output voltage to increase efficiency of the circuitry; and
an offset capacitive element coupled between a parallel amplifier output of the parallel amplifier and a feedback input of the parallel amplifier, wherein the offset capacitive element is configured to allow the power supply output voltage to be higher than a voltage at the parallel amplifier output.

2. Circuitry comprising:
a parallel amplifier configured to:
regulate a power supply output voltage based on a power supply control signal; and
provide a current sense signal, which is representative of a parallel amplifier output current from the parallel amplifier; and
a switching supply coupled to the parallel amplifier and configured to:
provide a switching output voltage;
make an early determination of the switching output voltage using the current sense signal and the power supply control signal to at least partially compensate for delay in the switching supply; and
drive the parallel amplifier output current toward zero using the switching output voltage to increase efficiency of the circuitry, such that the switching supply comprises switching circuitry and a first inductive element, wherein the switching circuitry has a switching circuitry output and is configured to provide the switching output voltage via the switching circuitry output; the first inductive element is coupled between the switching circuitry output and a feedback input of the parallel amplifier; and at least part of the delay in the switching supply is based on the first inductive element.

3. The circuitry of claim 2 wherein the switching supply further comprises a filter capacitive element coupled between a parallel amplifier output of the parallel amplifier and a ground, wherein at least part of the delay in the switching supply is further based on the filter capacitive element.

4. The circuitry of claim 1 wherein the parallel amplifier is further configured to regulate the power supply output voltage using a parallel amplifier control signal, which is representative of a voltage setpoint of the power supply output voltage; and the switching supply comprises delay compensation circuitry configured to receive and delay the power supply control signal to provide the parallel amplifier control signal.

5. The circuitry of claim 1 wherein the parallel amplifier is further configured to regulate the power supply output voltage using the power supply control signal, which is representative of a voltage setpoint of the power supply output voltage; and the early determination of the switching output voltage, is further based on a DC-DC converter compensation signal.

6. The circuitry of claim 5 wherein control circuitry is configured to provide the DC-DC converter compensation signal and the power supply control signal.

7. The circuitry of claim 1 wherein control circuitry is configured to provide the power supply control signal via a digital communications bus and a digital communications interface.

8. Circuitry comprising:
a parallel amplifier configured to:
regulate a power supply output voltage based on a power supply control signal; and
provide a current sense signal, which is representative of a parallel amplifier output current from the parallel amplifier; and
a switching supply coupled to the parallel amplifier and configured to:
provide a switching output voltage;
make an early determination of the switching output voltage using the current sense signal and the power supply control signal to at least partially compensate for delay in the switching supply;
drive the parallel amplifier output current toward zero using the switching output voltage to increase efficiency of the circuitry;
when a magnitude of the current sense signal is greater than a zero reference level, the switching supply is further configured to drive the switching output voltage to a high magnitude; and
when the magnitude of the current sense signal is less than the zero reference level, the switching supply is further configured to drive the switching output voltage to a low magnitude.

9. The circuitry of claim 8 wherein when the current sense signal has a positive time-rate-of-change, when the magnitude of the current sense signal is greater than a negative threshold, when a sum of the magnitude of the current sense signal and a time-rate-of-change of the power supply control signal is greater than a positive reference level, the switching supply is configured to drive the switching output voltage to the high magnitude.

10. The circuitry of claim 9 wherein when the current sense signal has a negative time-rate-of-change, when the magnitude of the current sense signal is less than a positive threshold, when the sum of the magnitude of the current sense signal and the time-rate-of-change of the power supply control signal is less than a negative reference level, the switching supply is further configured to drive the switching output voltage to the low magnitude.

11. The circuitry of claim 8 wherein when the current sense signal has a positive time-rate-of-change, when a sum of the magnitude of the current sense signal and a time-rate-of-change of the power supply control signal is greater than a positive reference level, the switching supply is configured to drive the switching output voltage to the high magnitude.

12. The circuitry of claim 11 wherein when the current sense signal has a negative time-rate-of-change, when the sum of the magnitude of the current sense signal and the time-rate-of-change of the power supply control signal is less than a negative reference level, the switching supply is further configured to drive the switching output voltage to the low magnitude.

13. The circuitry of claim 8 wherein when the current sense signal has a positive time-rate-of-change, when a sum of the magnitude of the current sense signal and a time-rate-of-change of the power supply control signal is greater than the zero reference level, the switching supply is configured to drive the switching output voltage to the high magnitude.

14. The circuitry of claim 13 wherein when the current sense signal has a negative time-rate-of-change, when the sum of the magnitude of the current sense signal and the time-rate-of-change of the power supply control signal is less than the zero reference level, the switching supply is further configured to drive the switching output voltage to the low magnitude.

15. The circuitry of claim 1 wherein a delay compensated DC-DC converter comprises the parallel amplifier and the switching supply, such that the delay compensated DC-DC converter is an envelope tracking power supply and the delay compensated DC-DC converter is configured to provide a power supply output signal, which is an envelope power supply signal; and the power supply output signal has the power supply output voltage.

16. The circuitry of claim 15 wherein a radio frequency (RF) power amplifier receives and amplifies an RF input signal to provide an RF transmit signal using the power supply output signal.

17. The circuitry of claim 1 wherein a bandwidth of the power supply output voltage is greater than 20 megahertz.

18. Circuitry comprising:
a parallel amplifier configured to:
  regulate a power supply output voltage based on a power supply control signal; and
  provide a current sense signal, which is representative of a parallel amplifier output current from the parallel amplifier; and
a switching supply, which comprises switching circuitry, a first inductive element, and a second inductive element, wherein the switching circuitry has a switching circuitry output; the first inductive element is coupled between the switching circuitry output and a feedback input of the parallel amplifier; the second inductive element is coupled between the first inductive element and a parallel amplifier output of the parallel amplifier; and the switching supply is coupled to the parallel amplifier, such that the switching supply is configured to:
  provide a switching output voltage via the switching circuitry output;
  make an early determination of the switching output voltage using the current sense signal and the power supply control signal to at least partially compensate for delay in the switching supply; and
  drive the parallel amplifier output current toward zero using the switching output voltage to increase efficiency of the circuitry.

19. A method comprising:
using a parallel amplifier to regulate a power supply output voltage based on a power supply control signal, which is representative of a voltage setpoint of the power supply output voltage;
providing a current sense signal, which is representative of a parallel amplifier output current from the parallel amplifier;
using a switching supply to provide a switching output voltage;
making an early determination of the switching output voltage using the current sense signal and the power supply control signal to at least partially compensate for delay in the switching supply, wherein the early determination of the switching output voltage is further based on a DC-DC converter compensation signal; and
driving the parallel amplifier output current toward zero using the switching output voltage to increase efficiency of a DC-DC converter.

\* \* \* \* \*